United States Patent
Ikuta (10) Patent No.: US 7,499,481 B2
(45) Date of Patent: Mar. 3, 2009

(54) SURFACE-EMITTING LASER AND METHOD FOR PRODUCING THE SAME

(75) Inventor: Mitsuhiro Ikuta, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/937,772

(22) Filed: Nov. 9, 2007

(65) Prior Publication Data

US 2008/0112442 A1    May 15, 2008

(30) Foreign Application Priority Data

Nov. 14, 2006  (JP)  ............................. 2006-307760
Aug. 31, 2007  (JP)  ............................. 2007-226337

(51) Int. Cl.
*H01S 5/00*  (2006.01)
*H01S 3/08*  (2006.01)

(52) U.S. Cl. ............................. 372/50.124; 372/46.013; 372/92

(58) Field of Classification Search ........................ None
See application file for complete search history.

(56) References Cited

U.S. PATENT DOCUMENTS

| | | | | |
|---|---|---|---|---|
| 5,719,891 | A * | 2/1998 | Jewell | 372/46.013 |
| 5,978,408 | A * | 11/1999 | Thornton | 372/96 |
| 6,545,335 | B1 * | 4/2003 | Chua et al. | 257/499 |
| 6,570,905 | B1 * | 5/2003 | Ebeling | 372/96 |
| 6,577,658 | B1 * | 6/2003 | Lee et al. | 372/45.01 |
| 6,674,090 | B1 * | 1/2004 | Chua et al. | 257/13 |
| 6,782,021 | B2 * | 8/2004 | Huang et al. | 372/45.013 |
| 6,967,985 | B2 * | 11/2005 | Tominaga et al. | 372/98 |
| 2003/0067009 | A1 | 4/2003 | Chua et al. | 257/84 |
| 2004/0114654 | A1 | 6/2004 | Kaneko | 372/46 |
| 2005/0089075 | A1 * | 4/2005 | Baba et al. | 372/50 |
| 2005/0265415 | A1 * | 12/2005 | Lambkin | 372/43.01 |

FOREIGN PATENT DOCUMENTS

| | | |
|---|---|---|
| JP | 2001-284722 A | 10/2001 |
| JP | 2004-119582 A | 4/2004 |
| JP | 2005-310917 A | 11/2005 |
| JP | 2005-347743 A | 12/2005 |
| JP | 2006-073823 | 3/2006 |

OTHER PUBLICATIONS

U.S. Appl. No. 11/916,230, filed Nov. 30, 2007.
U.S. Appl. No. 11/933,642, filed Nov. 1, 2007.
U.S. Appl. No. 11/940,124, filed Nov. 14, 2007.

* cited by examiner

*Primary Examiner*—Minsun Harvey
*Assistant Examiner*—Phillip Nguyen
(74) *Attorney, Agent, or Firm*—Fitzpatrick, Cella, Harper & Scinto

(57) ABSTRACT

A surface-emitting laser includes reflectors. One of the reflectors has multiple layers including one or more high-refractive-index layers and one or more low-refractive-index layers which are alternately stacked. At least one of the low-refractive-index layers includes a first region containing aluminum oxide and a second region surrounding the first region. A boundary between the first and second regions is positioned within a region where laser light is emitted. The reflectance of the multilayer reflector is higher in a portion including the first region than in a portion including the second region.

14 Claims, 4 Drawing Sheets

SURFACE-EMITTING LASER AND METHOD FOR PRODUCING THE SAME

BACKGROUND OF THE INVENTION

1. Field of the Invention

The present invention relates to surface-emitting lasers and methods for producing the lasers.

2. Description of the Related Art

A vertical-cavity surface-emitting laser (VCSEL) is a laser that emits laser light perpendicularly to the plane of its semiconductor substrate.

This type of surface-emitting laser generally includes a distributed Bragg reflector (DBR), typically formed by alternately stacking high-refractive-index layers and low-refractive-index layers with an optical thickness of $\lambda/4$.

Surface-emitting lasers have advantages over edge-emitting lasers in that they provide a stable single mode in terms of longitudinal-mode characteristics, have low thresholds, and can readily be produced as two-dimensional arrays. Surface-emitting lasers are expected to be applied to light sources for use in optical communication or transmission or in electrophotography.

An important challenge in surface-emitting lasers is to satisfactorily control the transverse mode of oscillation; a single transverse mode output is demanded for applications such as communication. To provide a single transverse mode, for example, a current confinement structure is formed in a surface-emitting laser by selective oxidation to limit the emission region of an active layer and a waveguide structure is simultaneously formed with the selectively oxidized portion.

In this method, the diameter of confinement must be reduced to achieve oscillation in a single transverse mode. A reduced diameter of confinement, however, results in a narrowed emission region, thus making it difficult to produce a high laser output.

Japanese Patent Laid-Open No. 2006-073823 (Patent Document 1), for example, proposes a surface-emitting laser that includes a multilayer reflector defining a resonator and having a higher reflectance in the center of the reflector and a lower reflectance in the periphery of the reflector. According to Patent Document 1, this surface-emitting laser can suppress oscillation in higher-order modes to achieve oscillation in a single transverse mode even for larger diameters of current confinement than normal after selective oxidation.

The surface-emitting laser disclosed in Patent Document 1 will now be described with reference to FIGS. 4A and 4B.

Figure 4A:
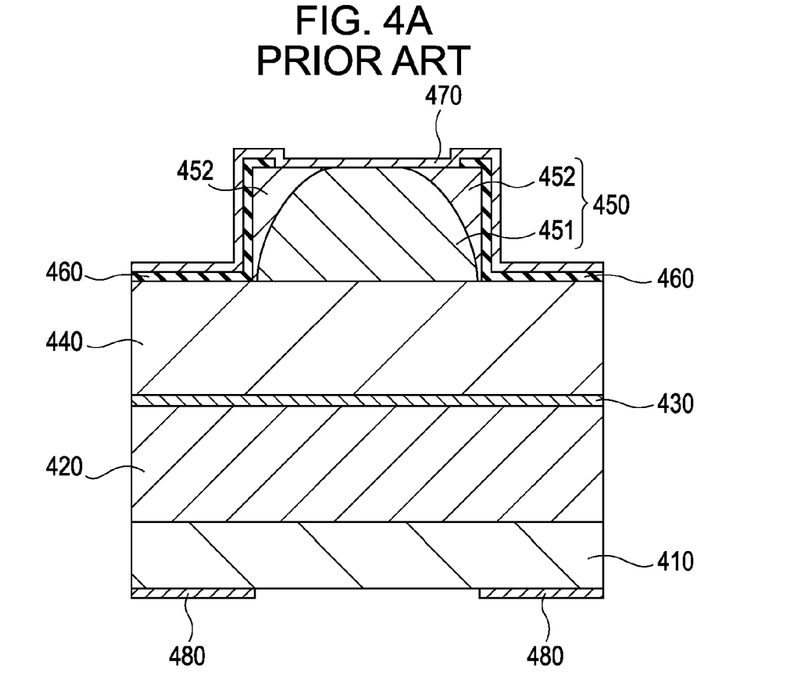
FIG. 4A is a schematic sectional view of an example of a surface-emitting laser of the related art and FIG. 4B is a schematic partial enlarged view of the surface-emitting laser.

FIG. 4A shows a schematic structure of the surface-emitting laser as an example of the related art. The top of the laser has a mesa structure. A lower reflector 420, an active layer 430, a first upper reflector 440, and a second upper reflector 450 are sequentially formed on a substrate 410. An insulating film 460 and an electrode 470 are formed on the second upper reflector 450. The second upper reflector 450 includes an aluminum oxide region 452 formed by selective oxidation in the periphery thereof and an unoxidized region 451 in the center thereof.

Figure 4B:
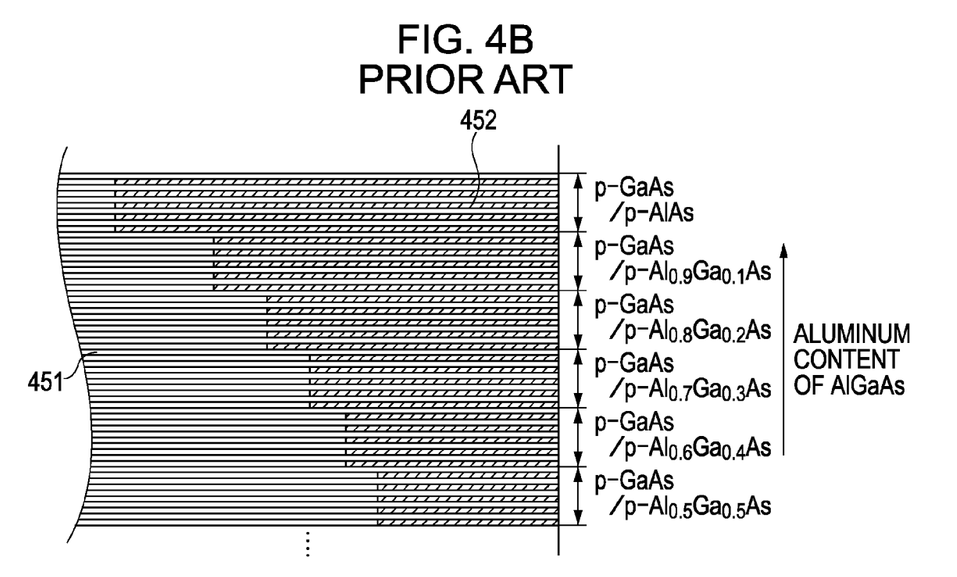

FIG. 4B is a schematic enlarged view of the right half of the second upper reflector 450. The second upper reflector 450 is formed so that the aluminum content (x) of $Al_xGa_{1-x}As$ layers, functioning as low-refractive-index layers, increases gradually in a direction away from the active layer 430.

Next, a method for forming the first upper reflector 440 and the second upper reflector 450 will be described.

First, the high-refractive-index layers and low-refractive-index layers of the upper reflectors 440 and 450 are stacked on top of each other. The thickness t of each layer satisfies the condition $t=\lambda/(4n)$, where $\lambda$ is the laser oscillation wavelength and n is the refractive index of the individual layers.

The stacked films are then oxidized in the transverse direction by heat treatment in a steam atmosphere. The low-refractive-index layers of the second upper reflector 450 have such a composition that the aluminum content increases gradually in the direction away from the active layer 430. Because the oxidation rate increases with the aluminum content, the aluminum oxide region 452 is formed in the second upper reflector 450 such that the area of the region 452 increases in the direction away from the active layer 430, as shown in FIGS. 4A and 4B.

Because aluminum oxide has a lower refractive index than $Al_xGa_{1-x}As$, namely, about 1.8, the condition satisfied before the oxidation, $t=\lambda/(4n)$, is no longer satisfied after the oxidation. This results in a higher reflectance in the center of the second upper reflector 450 and a lower reflectance in the periphery of the reflector 450. According to Patent Document 1, the multilayer reflector with such a reflectance distribution suppresses oscillation in higher-order modes.

In the surface-emitting laser according to Patent Document 1, as described above, the aluminum-containing layers are selectively oxidized in the transverse direction to decrease the reflectance of the periphery of the layers.

In the transverse oxidation proposed in Patent Document 1, however, the oxidation rate increases rapidly as the oxidation approaches the center of the multilayer reflector. It is therefore difficult to terminate the oxidation reaction proceeding toward the center of the multilayer reflector in the transverse direction at a target position.

SUMMARY OF THE INVENTION

The present invention provides a surface-emitting laser that can be produced in high yield and can achieve oscillation in a single transverse mode without the need to oxidize a multilayer reflector in a transverse direction, and also provides a method for producing such a surface-emitting laser.

A surface-emitting laser according to the present invention includes a substrate, a pair of reflectors disposed on the substrate, and an active layer disposed between the pair of reflectors. At least one of the pair of reflectors is a multilayer reflector including one or more layers having a first refractive index and one or more layers having a second refractive index lower than the first refractive index. The layers having the first and second refractive indices are alternately stacked. At least one of the layers having the second refractive index includes a first region and a second region surrounding the first region in a plane parallel to the substrate. The first region contains aluminum oxide and has a lower refractive index than the second region. A boundary between the first region and the second region is positioned within a region where laser light is emitted. The reflectance of the multilayer reflector for the laser light in a direction perpendicular to the substrate is higher in a portion including the first region than in a portion including the second region.

A method for producing a surface-emitting laser according to the present invention includes the steps of forming a multilayer reflector by alternately stacking one or more layers having a first refractive index and one or more layers having a second refractive index lower than the first refractive index; and oxidizing at least one of the layers having the second refractive index to form a first region containing aluminum oxide and a second region surrounding the first region in a plane parallel to a substrate. A boundary between the first region and the second region is defined within a region where laser light is emitted in the oxidation step. The reflectance of the multilayer reflector for the laser light in a direction perpendicular to the substrate is higher in a portion including the first region than in a portion including the second region.

The present invention can thus provide a surface-emitting laser that can be produced in high yield and can achieve oscillation in a single transverse mode without the need to oxidize a multilayer reflector in a transverse direction, and can also provide a method for producing such a surface-emitting laser.

Further features of the present invention will become apparent from the following description of exemplary embodiments with reference to the attached drawings.

DESCRIPTION OF THE EMBODIMENTS

The present invention is characterized in that the reflectance of the center of a multilayer reflector is increased by oxidizing the center. That is, the present invention differs from that discussed in Patent Document 1 in that the reflectance of the center of a multilayer reflector is increased by oxidizing the center in the present invention while the reflectance of the periphery of a multilayer reflector is decreased by oxidizing the periphery in the invention of Patent Document 1.

Embodiments of the present invention will now be described with reference to the drawings, wherein like reference numerals refer to like or corresponding portions.

First Embodiment

Figure 1A:
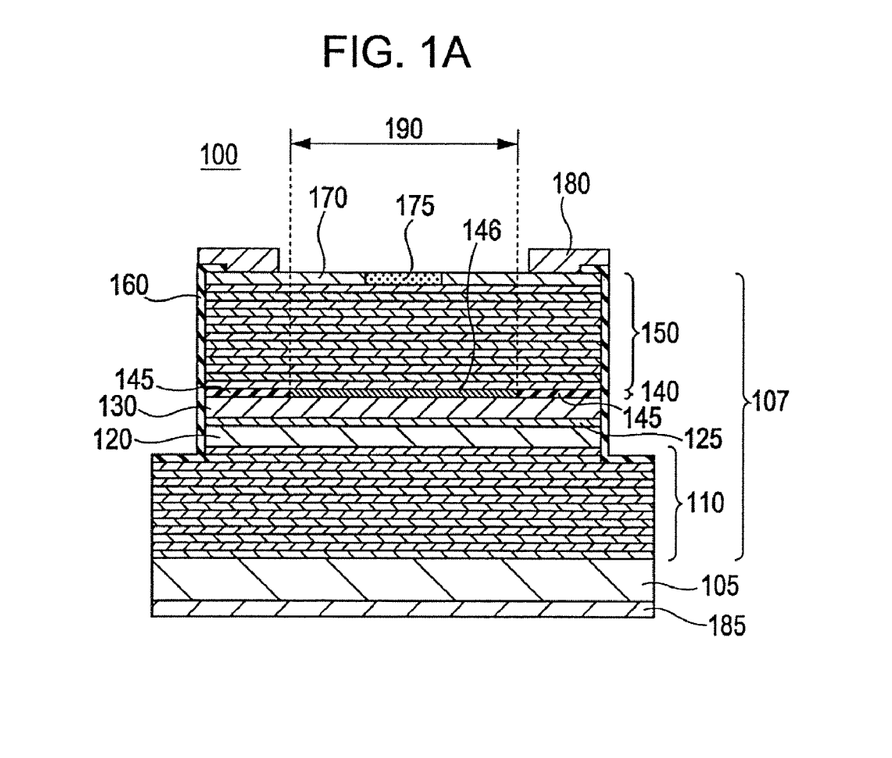
FIG. 1A is a schematic sectional view of a surface-emitting laser according to a first embodiment and FIG. 1B is a schematic top view of the surface-emitting laser.
Figure 1B:
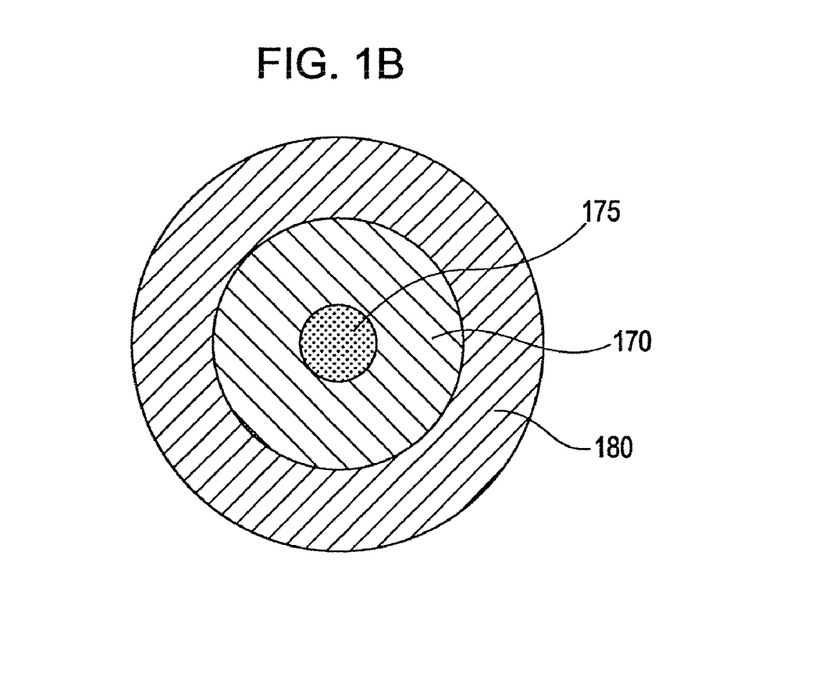

FIG. 1A is a schematic sectional view of a surface-emitting laser 100 according to a first embodiment. FIG. 1B is a schematic top view of the surface-emitting laser 100.

In FIG. 1A, the surface-emitting laser 100 includes a substrate 105 on which a resonator 107 is formed. The top of the surface-emitting laser 100 has a mesa structure. The resonator 107 includes a lower multilayer reflector 110, a lower cladding layer 120, an active layer 125, an upper cladding layer 130, a current-confining layer 140 for forming a current confinement structure, and an upper multilayer reflector 150. That is, the pair of reflectors 110 and 150 are provided on the substrate 105, with the active layer 125 disposed between the reflectors 110 and 150. An upper electrode 180 is disposed on the upper multilayer reflector 150, and a lower electrode 185 is disposed on the substrate 105.

The upper multilayer reflector 150 is formed by alternately stacking high-refractive-index layers, used as layers having a first refractive index, and low-refractive-index layers, used as layers having a second refractive index. The topmost layer of the upper multilayer reflector 150 is a low-refractive-index layer including a first region 175 containing aluminum oxide in the center of a region 190 where laser light is emitted and a second region 170 around the first region 175. As shown in the top view of FIG. 1B, specifically, the second region 170 is formed so as to surround the first region 175 in a plane parallel to the substrate 105, and the boundary between the two regions 170 and 175 is positioned within the region 190 where laser light is emitted.

A current confinement structure defined by an oxidized portion 145 and an unoxidized portion 146 of the current-confining layer 140 predominantly determines the region 190 where laser light is emitted. An injected current bypasses the oxidized portion 145 and flows through the unoxidized portion 146 to enter the active layer 125 because the oxidized portion 145 is an insulating layer. The size of the unoxidized portion 146 thus determines the size of the emission region.

The reflectance of the upper multilayer reflector 150 for the laser light output in a direction perpendicular to the substrate 105 is higher in a portion including the first region 175 in the center of the reflector 150 than in a portion including the second region 170 in the periphery of the reflector 150. Because the upper multilayer reflector 150 has such a reflectance distribution for the laser light output, it can suppress oscillation in higher-order modes to increase the possibility of oscillation in a single transverse mode.

To form such a reflectance distribution in the upper multilayer reflector 150, the thickness of the topmost layer of the upper multilayer reflector 150 is determined so as to satisfy the condition $t=\lambda/(4n)$ after oxidation, where t is thickness, $\lambda$ is the laser oscillation wavelength, and n is refractive index.

If the thickness is determined as above, the first region 175 will contain aluminum oxide and satisfy the condition $t=\lambda/(4n)$ after oxidation.

The second region 170, which is not oxidized, has a higher refractive index than the first region 175, which is oxidized, even though the thickness of the second region 170 is equal to or slightly larger than that of the first region 175. Therefore, the second region 170 does not satisfy the condition $t=\lambda/(4n)$, and the portion including the second region 170 has a lower reflectance than the portion including the first region 175. The thickness should be determined with consideration given to the fact that the thickness of a semiconductor layer containing aluminum can be decreased by a maximum of about 10% after oxidation.

The thickness t of the topmost layer does not necessarily have to satisfy the condition $t=\lambda/(4n)$ as long as the upper multilayer reflector 150 has a higher reflectance in the portion including the first region 175 than in the portion including the second region 170. For example, the first region 175 can provide a higher reflectance if the total optical thickness of the first region 175 and the high-refractive-index layer is half an integral multiple of the laser oscillation wavelength $\lambda$ (e.g., $\lambda/2$ or $(3\lambda)/2$) and the pair is positioned so as to match the phase of the resonator 107. In the description below, satisfying the condition where the total optical thickness of a high-refractive-index layer and a low-refractive-index layer is half an integral multiple of the laser oscillation wavelength $\lambda$ and the pair is positioned so as to match the phase of the resonator 107 is also referred to as "satisfying the Bragg condition".

In this embodiment, the low-refractive-index layers of the upper multilayer reflector 150 between the active layer 125 and the low-refractive-index layer including the first region 175 and the second region 170 (topmost layer) have a lower resistivity than the first region 175. That is, the other low-refractive-index layers of the upper multilayer reflector 150 have a lower resistivity than the first region 175 containing aluminum oxide. This ensures a channel through which a current flows into the active layer 125 between the electrode 180 and the active layer 125.

The first region 175 containing aluminum oxide can also contain impurities such as carbon, gallium, and arsenic, which could contaminate the first region 175 during a production process.

Although the first region 175 is provided in the center of the region 190 where laser light is emitted in FIG. 1B, the first region 175 does not necessarily have to be provided in the center of the region 190, but can be provided at any position where the first region 175 remains effective for oscillation in a single transverse mode.

In addition, it is not necessary that the entire boundary between the first region 175 and the second region 170 be positioned within the region 190 where laser light is emitted, but at least part of the boundary must be positioned within the region 190.

Although the current confinement structure is formed by oxidation in this embodiment, it can also be formed by proton implantation.

In the surface-emitting laser 100 according to the first embodiment, as described above, the reflectance of the upper multilayer reflector 150 for laser light in the direction perpendicular to the substrate 105 is higher in the portion including the first region 175 than in the portion including the second region 170 surrounding the first region 175. The upper multilayer reflector 150 thus causes a larger optical loss in higher-order transverse modes than in a zeroth-order mode. This contributes to suppression of oscillation in higher-order transverse modes even for larger diameters of current confinement.

In addition, the first region 175 has an antiwaveguide structure because it has a lower refractive index than the second region 170. The surface-emitting laser 100 can therefore readily achieve a single-mode condition even for larger diameters of current confinement.

A multilayer reflector having a larger difference in refractive index between low-refractive-index layers and high-refractive-index layers provides a higher reflectance over a wider wavelength band.

As the difference in refractive index is increased, additionally, the multilayer reflector requires fewer layers to achieve the same reflectance, and the cost of forming the multilayer reflector can be reduced accordingly.

In general, an aluminum oxide layer has a significantly lower refractive index than an unoxidized semiconductor layer. For example, $Al_{0.93}Ga_{0.07}As$ and $Al_{0.5}Ga_{0.5}As$ have refractive indices of about 3.1 and about 3.4, respectively, for light with a wavelength of 670 nm while aluminum oxide, formed through oxidation of $Al_xGa_{1-x}As$, has a refractive index of about 1.8.

Hence, a multilayer reflector in which part of a low-refractive-index layer contains aluminum oxide can ensure a larger difference in refractive index than an unoxidized multilayer reflector. The multilayer reflector including the aluminum oxide layer thus requires fewer layers to provide a wide-band, high-reflectance mirror than a multilayer reflector including unoxidized semiconductor layers.

Next, a method for producing the surface-emitting laser 100 according to the first embodiment will be described.

First, pairs of low-refractive-index layers and high-refractive-index layers are stacked on the substrate 105 to form the lower multilayer reflector 110. The low-refractive-index layers and the high-refractive-index layers are formed by, for example, metal-organic chemical vapor deposition (MOCVD) or molecular beam epitaxy (MBE). The substrate 105 used is an n-type semiconductor substrate such as an n-type GaAs substrate.

The materials of the low-refractive-index layers and the high-refractive-index layers can be selected from materials that do not absorb light with the laser oscillation wavelength. In this example, n-type $Al_{0.93}Ga_{0.07}As$ layers with a thickness of 49 nm are used as the low-refractive-index layers to ensure high transmittance for light with a wavelength of 670 nm and a large difference in refractive index between the low-refractive-index layers and the high-refractive-index layers. The high-refractive-index layers used are n-type $Al_{0.5}Ga_{0.5}As$ layers with a thickness of 54 nm, and 70 pairs are stacked on top of each other. The above step is referred to as a step of forming a multilayer reflector.

The lower cladding layer 120, the active layer 125, the upper cladding layer 130, and the current-confining layer 140 are formed on the lower multilayer reflector 110 by, for example, MOCVD.

The lower cladding layer 120 used is an n-type semiconductor layer such as an n-type $Al_{0.93}Ga_{0.07}As$ layer.

The active layer 125 used is, for example, a GaInP/AlGaInP quantum-well layer, which has an optical gain at a wavelength of 670 nm.

The upper cladding layer 130 used is a p-type semiconductor layer such as a p-type $Al_{0.93}Ga_{0.07}As$ layer.

The lower cladding layer 120, the active layer 125, and the upper cladding layer 130 can be formed so that the total optical thickness thereof is substantially equivalent to the laser oscillation wavelength.

The current-confining layer 140 is formed by, for example, growing an aluminum-rich AlGaAs layer, for example, a p-type $Al_{0.98}Ga_{0.02}As$ layer, to a thickness of 20 nm.

Next, pairs of low-refractive-index layers and high-refractive-index layers are stacked on the current-confining layer 140 to form the upper multilayer reflector 150.

The materials of the low-refractive-index layers and the high-refractive-index layers can be selected from the materials described above. For example, 35 pairs are stacked on top of each other, including p-type $Al_{0.93}Ga_{0.07}As$ layers with a thickness of 49 nm, as the low-refractive-index layers, and p-type $Al_{0.5}Ga_{0.5}As$ layers with a thickness of 54 nm, as the high-refractive-index layers.

The topmost layer is a semiconductor layer having a higher aluminum content than the underlying low-refractive-index layers. The topmost layer should be formed to a thickness determined with consideration of the refractive index of aluminum oxide so that the reflectance increases after the oxidation. In this example, a p-type $Al_{0.97}Ga_{0.03}As$ layer is formed to a thickness of 93 nm so that the optical thickness is equal to a quarter of the laser oscillation wavelength after the oxidation.

The resonator 107 thus formed, including the upper multilayer reflector 150 and the current-confining layer 140, is partially removed by, for example, photolithography and etching to form a mesa structure. The current-confining layer 140 is externally selectively oxidized to form the oxidized portion 145, thus defining a current confinement structure. The side surfaces of the multilayer reflectors 110 and 150 can be slightly oxidized during the formation of the current confinement structure by oxidation.

An insulating film 160 is formed on the upper multilayer reflector 150. The insulating film 160 is formed of, for example, $SiO_2$ or $SiN_x$. An opening is formed in the insulating film 160 by, for example, photolithography and etching to allow contact with the upper electrode 180.

The center of the topmost p-type $Al_{0.97}Ga_{0.03}As$ layer of the upper multilayer reflector 150 is then oxidized using a mask with an appropriate opening pattern to form the first region 175 containing aluminum oxide.

The region to be oxidized is determined so that the oxidation is effective for oscillation in a single transverse mode. Specifically, the shape of the region to be oxidized is determined in terms of the modes defined by the oxidation confinement structure, that is, so that the effect of confining light is larger in a zeroth-order mode than in higher-order modes. For example, a region of a shape smaller than the diameter of oxidation confinement can be oxidized.

The topmost layer can be partially oxidized by, for example, heat treatment in steam at 300° C. to 500° C. for 5 to 30 minutes. Because the thickness of the topmost layer has been controlled in advance as described above, the portion including the oxidized region, namely, the first region 175, has a higher reflectance than the portion including the second region 170 after the oxidation.

The upper electrode 180 is then formed in the opening of the insulating film 160 by, for example, electron beam deposition and a lift-off process to allow contact with the upper multilayer reflector 150. The upper electrode 180 is formed of, for example, a layered film including a titanium film and a gold film and has an opening through which light is emitted.

The lower electrode 185 is formed on the substrate 105 by, for example, metal vapor deposition through resistance heating. The lower electrode 185 is formed of, for example, a layered film including a gold-germanium alloy film and a gold film.

In the above method for producing the surface-emitting laser 100, the refractive index of the center of the multilayer reflector 150 can be defined by oxidation using a mask. The refractive index can therefore be controlled more readily than by the method discussed in Patent Document 1 in which the refractive index is controlled by oxidation in the transverse direction.

Although the upper multilayer reflector 150 includes the first region 175 and the second region 170 in the first embodiment, the lower multilayer reflector 110 can include the two regions 175 and 170. In this case, a layer in which the first region 175 and the second region 170 are to be formed is formed between the lower multilayer reflector 110 and the substrate 105 when the individual layers are formed by, for example, MOCVD. Before or after the formation of the mesa structure, part of the substrate 105 is removed, and the first region 175 is formed by oxidation using an appropriate mask.

In this case, as in the first embodiment, the surface-emitting laser 100 can provide the effect of suppressing oscillation in higher-order modes to achieve oscillation in a single zeroth-order transverse mode.

Second Embodiment

Figure 2A:
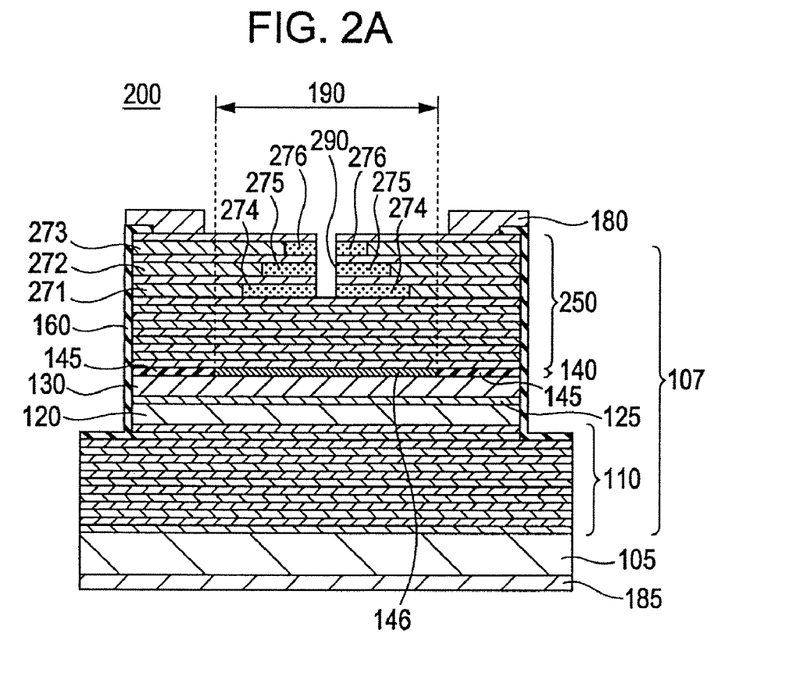
FIG. 2A is a schematic sectional view of a surface-emitting laser according to a second embodiment.
Figure 2B:
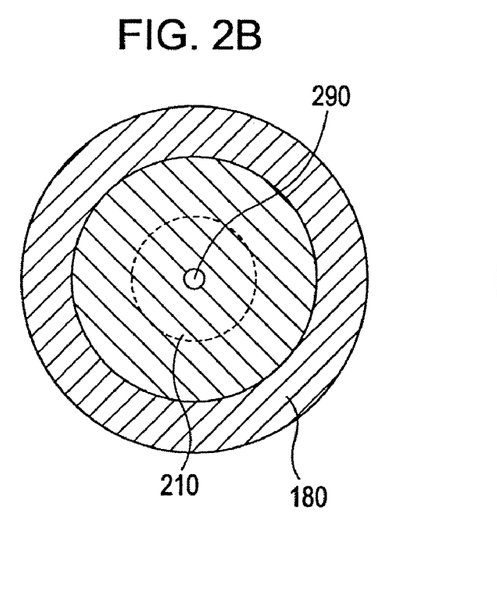
FIG. 2B is a schematic top view of the surface-emitting laser.

FIG. 2A is a schematic sectional view of a surface-emitting laser 200 according to a second embodiment. FIG. 2B is a schematic top view of the surface-emitting laser 200.

The surface-emitting laser 200 according to the second embodiment has substantially the same structure as the surface-emitting laser 100 according to the first embodiment except that an upper multilayer reflector 250, corresponding to the upper multilayer reflector 150 in the first embodiment, includes first regions 274, 275, and 276 having a point-like pore 290. The second embodiment is characterized in that an oxidized region 210, as indicated by the dotted line, is formed by oxidation through the point-like pore 290.

In the second embodiment, as shown in FIG. 2A, a plurality of low-refractive-index layers include the respective first regions 274, 275, and 276 and the respective second regions. The area of the first regions 274, 275, and 276, which contain aluminum oxide, increases gradually toward the active layer 125. This structure allows the reflectance to be decreased stepwise from center to periphery, thus more effectively suppressing oscillation in higher-order transverse modes.

The aluminum content of the low-refractive-index layers can be increased toward the active layer 125 so that the area of the first regions 274, 275, and 276 increases toward the active layer 125. This technique is based on the fact that the oxidation rate increases with the aluminum content.

Alternatively, the thickness of the low-refractive-index layers can be increased toward the active layer 125. This technique is based on the fact that the oxidation rate increases with the thickness.

The size of the pore 290 used for oxidation can be reduced to suppress scattering of light by the pore 290 because the pore 290 is formed in the center of the multilayer reflector 250, which is required to confine light. The pore 290 can have a diameter of 3 μm or less, particularly 1 μm or less, in terms of ease of formation. More particularly, the pore 290 can have a diameter of 100 nm or less if a priority is given to suppression of light scattering. The pore 290 does not have to have a circular shape, but can also have a polygonal shape such as a square shape.

In the surface-emitting laser 200 according to the second embodiment, as described above, the refractive index of the center of the upper multilayer reflector 250 can be initially defined by oxidation through the pore 290 formed in the center of the reflector 250. The refractive index can therefore be controlled more readily than by the method discussed in Patent Document 1 in which the refractive index is controlled by oxidation in the transverse direction. This method has the advantage that an oscillation failure rarely occurs even if the oxidation proceeds beyond the region to be oxidized in design.

The pore 290 can be filled with a resin. The resin can provide a higher refractive index in the pore 290 than air to suppress scattering of light at the interfaces between the pore 290 and, for example, the first regions 274, 275, and 276. The resin therefore has the effect of suppressing a decrease in reflectance. In addition, the resin can prevent damage (for example, oxidation) to the interior of the upper multilayer reflector 250 through the pore surface.

To suppress a loss due to the pore 290, it can be filled with a resin that absorbs less light at the laser oscillation wavelength. An example of the resin used to fill the pore 290 is an organic polymer such as polyimide.

In addition, the pore 290 can be filled with a material other than resins, for example, an inorganic material such as $SiO_2$, SiN, or $Al_2O_3$, to suppress scattering of light at the interfaces and prevent damage, such as oxidation, through the pore surface.

Figure 2C:
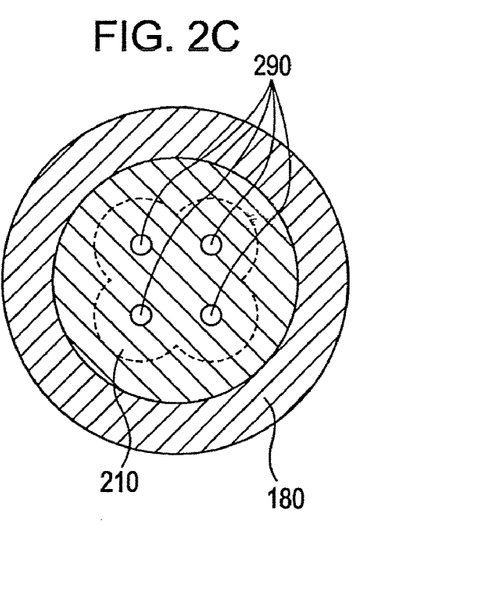
FIG. 2C is a schematic top view of a surface-emitting laser according to a modification of the second embodiment.

Referring to FIG. 2C, alternatively, a plurality of pores 290 can be formed. In FIG. 2C, four pores 290 are formed. In this case, the center of the upper multilayer reflector 250 can be oxidized without forming a pore in the center of the reflector 250. In comparison with the pore 290 formed in the center of the multilayer reflector 250, the pores 290 shown in FIG. 2C have the advantage that they cause less light scattering if the electric field strength of a zeroth-order transverse mode is maximized in the center of the reflector 250.

Next, the method for forming the upper multilayer reflector 250, which differs from the upper multilayer reflector 150 in the first embodiment, will be described. The steps through the step of forming the current-confining layer 140 will not be described because these steps are the same as those in the first embodiment.

The upper multilayer reflector 250 is formed on the current-confining layer 140. The high-refractive-index layers and the low-refractive-index layers can be formed of the materials described in the first embodiment.

In this example, 30 pairs are stacked on top of each other, including p-type $Al_{0.93}Ga_{0.07}As$ layers with a thickness of 49 nm, as the low-refractive-index layers, and p-type $Al_{0.5}Ga_{0.5}As$ layers with a thickness of 54 nm, as the high-refractive-index layers. In addition, 3 pairs are stacked thereon, including p-type $Al_{0.97}Ga_{0.03}As$ layers 271, 272, and 273, as the low-refractive-index layers, and p-type $Al_{0.5}Ga_{0.5}As$ layers, as the high-refractive-index layers. Thus, the upper multilayer reflector 250 is formed.

The p-type $Al_{0.97}Ga_{0.03}As$ layers 271, 272, and 273, serving as the low-refractive-index layers, are stacked in descending order of thickness. For example, the p-type $Al_{0.97}Ga_{0.03}As$ layers 271, 272, and 273 have thicknesses of 100 nm, 90 nm, and 80 nm, respectively. The p-type $Al_{0.5}Ga_{0.5}As$ layers paired with the p-type $Al_{0.97}Ga_{0.03}As$ layers 271, 272, and 273, serving as the high-refractive-index layers, are formed to such a thickness that the Bragg condition is satisfied after the first regions 274, 275, and 276 are formed by oxidizing the p-type $Al_{0.97}Ga_{0.03}As$ layers 271, 272, and 273, respectively. To achieve a higher reflectance, the low-refractive-index layers and the high-refractive-index layers can be formed so as to satisfy the condition $t=\lambda/(4n)$.

As in the first embodiment, a mesa structure is formed, the current-confining layer 140 is selectively oxidized, and the insulating film 160 is formed.

The point-like pore 290 is then formed in the upper multilayer reflector 250. The point-like pore 290 can be formed by, for example, patterning using electron beam photolithography and inductively coupled plasma (ICP) etching. The size of the point-like pore 290 can be selected as described above. In this example, the point-like pore 290 is formed to a diameter of 1 μm to suppress scattering of light by the pore 290.

The point-like pore 290 penetrates the p-type $Al_{0.97}Ga_{0.03}As$ layers 271, 272, and 273, serving as the low-refractive-index layers. The p-type $Al_{0.97}Ga_{0.03}As$ layers 271, 272, and 273 are oxidized through the point-like pore 290 to form the first regions 274, 275, and 276, which contain aluminum oxide. As in the first embodiment, the p-type $Al_{0.97}Ga_{0.03}As$ layers 271, 272, and 273 are oxidized by heat treatment in steam at 300° C. to 500° C. for 5 to 30 minutes.

Finally, the electrodes 180 and 185 are formed as in the first embodiment.

Additional semiconductor layers can be stacked after the formation of the point-like pore 290 and the oxidation through the point-like pore 290.

Third Embodiment

Figure 3A:
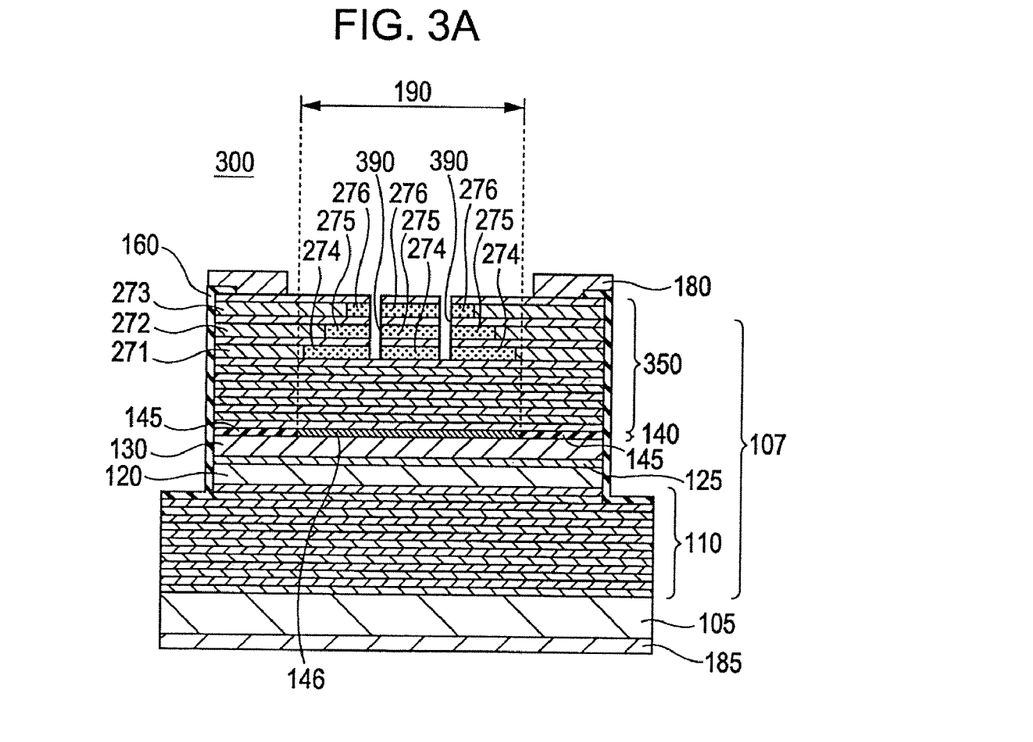
FIG. 3A is a schematic sectional view of a surface-emitting laser according to a third embodiment and FIG. 3B is a schematic top view of the surface-emitting laser.
Figure 3B:
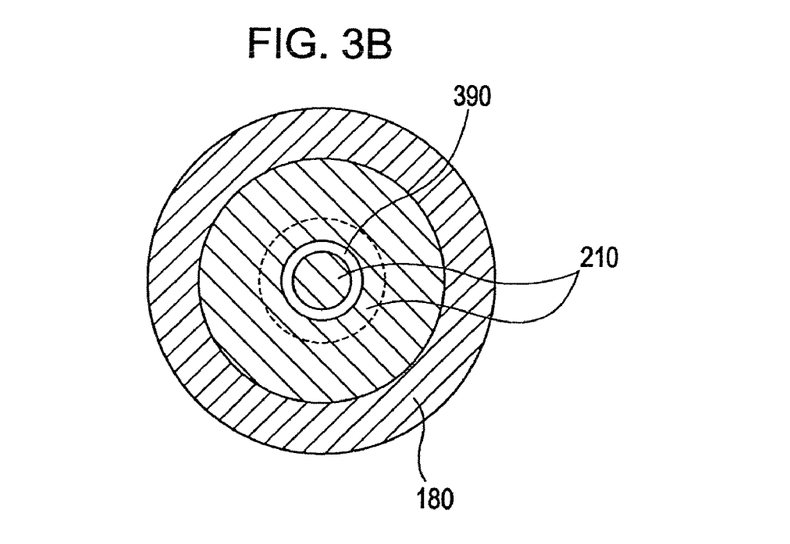

FIG. 3A is a schematic sectional view of a surface-emitting laser 300 according to a third embodiment. FIG. 3B is a schematic top view of the surface-emitting laser 300.

The surface-emitting laser 300 according to the third embodiment has substantially the same structure as the surface-emitting laser 200 according to the second embodiment except that an upper multilayer reflector 350, corresponding to the upper multilayer reflector 250 in the second embodiment, has an annular pore 390 formed in the top of the reflector 350 instead of the point-like pore 290 in the second embodiment.

The formation of the annular pore 390 eliminates the need to form a pore in the center of the upper multilayer reflector 350 as shown in FIG. 2A. In comparison with the pore 290 formed in the center of the multilayer reflector 250, the annular pore 390 has the advantage that it causes less light scattering if the electric field strength of a zeroth-order transverse mode is maximized in the center of the reflector 350.

Next, the method for forming the upper multilayer reflector 350 in the third embodiment will be described. The steps through the step of forming the insulating film 160 will not be described because these steps are the same as those in the second embodiment.

After the insulating film 160 is formed, the annular pore 390 is formed in the upper multilayer reflector 150 using, for example, photolithography.

The annular pore 390 can have a diameter of about several times the wavelength in terms of oscillation in a single transverse mode. In this example, the annular pore 390 has an inner diameter of 4 μm and an outer diameter of 6 μm because the annular pore 390 causes less scattering as the diameter is reduced. The p-type $Al_{0.97}Ga_{0.03}As$ layers 271, 272, and 273, serving as the low-refractive-index layers, are oxidized through the annular pore 390 to form the respective first regions 274, 275, and 276, which contain aluminum oxide. As in the first and second embodiments, the p-type $Al_{0.97}Ga_{0.03}As$ layers 271, 272, and 273 are oxidized by heat treatment in steam at 300° C. to 500° C. for 5 to 30 minutes.

Finally, the electrodes 180 and 185 are formed as in the first and second embodiments.

As described in the second embodiment, alternatively, a plurality of annular pores 390 can be formed. In addition, the annular pore 390 can be filled with, for example, a resin.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-307760 filed Nov. 14, 2006 and No. 2007-226337 filed Aug. 31, 2007, which are hereby incorporated by reference herein in their entirety.

What is claimed is:

1. A surface-emitting laser comprising:
   a substrate;
   a pair of reflectors disposed on the substrate; and
   an active layer disposed between the pair of reflectors;
   wherein at least one of the pair of reflectors is a multilayer reflector including one or more layers having a first refractive index and one or more layers having a second refractive index lower than the first refractive index, wherein the layers having the first and second refractive indices are alternately stacked;
   at least one of the layers having the second refractive index includes a first region and a second region surrounding the first region in a plane parallel to the substrate;
   the first region contains aluminum oxide and has a lower refractive index than the second region;
   a boundary between the first region and the second region is positioned within a region where laser light is emitted; and
   the reflectance of the multilayer reflector for the laser light in a direction perpendicular to the substrate is higher in a portion including the first region than in a portion including the second region.

2. The surface-emitting laser according to claim 1, wherein the first region includes at least one pore.

3. The surface-emitting laser according to claim 2, wherein the first region includes a plurality of pores.

4. The surface-emitting laser according to claim 2, wherein the pore has an annular shape.

5. The surface-emitting laser according to claim 2, wherein the pore is filled with a resin.

6. The surface-emitting laser according to claim 1, wherein a plurality of the layers having the second refractive index include the first region and the second region and are stacked so that the area of the first region increases gradually toward the active layer.

7. The surface-emitting laser according to claim 1, wherein at least one of the layers having the second refractive index between the active layer and the layer including the first region and the second region has a lower resistivity than the first region.

8. A method for producing a surface-emitting laser including an active layer and at least one multilayer reflector on a substrate, the method comprising the steps of:
   forming the multilayer reflector by alternately stacking one or more layers having a first refractive index and one or more layers having a second refractive index lower than the first refractive index; and
   oxidizing at least one of the layers having the second refractive index to form a first region containing aluminum oxide and a second region surrounding the first region in a plane parallel to the substrate;
   wherein a boundary between the first region and the second region is defined within a region where laser light is emitted in the oxidation step; and
   the reflectance of the multilayer reflector for the laser light in a direction perpendicular to the substrate is higher in a portion including the first region than in a portion including the second region.

9. The method for producing the surface-emitting laser according to claim 8, wherein the oxidation step is performed using a mask.

10. The method for producing the surface-emitting laser according to claim 8, further comprising a step of forming at least one pore in the multilayer reflector before the oxidation step, wherein the oxidation step is performed through the pore.

11. The method for producing the surface-emitting laser according to claim 10, wherein an annular pore is formed in the pore-forming step.

12. The method for producing the surface-emitting laser according to claim 10, wherein a plurality of pores are formed in the pore-forming step.

13. The method for producing the surface-emitting laser according to claim 10, further comprising a step of filling the pore with a resin.

14. The method for producing the surface-emitting laser according to claim 10, wherein the layers having the second refractive index are stacked so that the aluminum content thereof increases gradually toward the active layer in the step of forming the multilayer reflector.

* * * * *